US010163761B2

(12) United States Patent
Bogen et al.

(10) Patent No.: US 10,163,761 B2
(45) Date of Patent: Dec. 25, 2018

(54) POWER SEMICONDUCTOR ARRANGEMENT

(71) Applicant: Semikron Elektronik GmbH & Co., KG, Nürnberg (DE)

(72) Inventors: Ingo Bogen, Nürnberg (DE); Ludwig Hager, Nürnberg (DE); Rainer Weiß, Erlangen (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 399 days.

(21) Appl. No.: 14/713,202

(22) Filed: May 15, 2015

(65) Prior Publication Data

US 2017/0186673 A1    Jun. 29, 2017

(30) Foreign Application Priority Data

May 15, 2014   (DE) .................. 10 2014 106 857

(51) Int. Cl.
*H05K 5/00*   (2006.01)
*H05K 7/00*   (2006.01)
(Continued)

(52) U.S. Cl.
CPC ........ *H01L 23/49562* (2013.01); *H01L 23/04* (2013.01); *H01L 23/473* (2013.01);
(Continued)

(58) Field of Classification Search
CPC ...................................................... H05K 7/14
(Continued)

(56) References Cited

U.S. PATENT DOCUMENTS 7,445,519 B2   11/2008   Matsumoto
7,817,406 B2   10/2010   Bremicker
(Continued)

FOREIGN PATENT DOCUMENTS

CN       2541952 Y     3/2003
CN     101465594 A     6/2009
(Continued)

OTHER PUBLICATIONS

Office Action and Search Report from the Chinese Patent Office in the corresponding Chinese application, dated May 18, 2018.

*Primary Examiner* — Jerry Wu
(74) *Attorney, Agent, or Firm* — The Law Offices of Roger; S. Thompson

(57) ABSTRACT

A power semiconductor device comprises a substrate; and power semiconductor components disposed on and connected thereto. The device includes a housing part with a housing wall having a first cutout. The device has, for making electrical contact therewith, a unitary load connection element which passes through the first cutout in an X direction, is electrically conductive, and has an outer connection section disposed outside the housing part and an inner connection section disposed within the housing part. A first bush which has an internal thread running in the X direction is rotationally fixed and movable in the X direction in the housing wall. The first outer connection section has a second cutout aligned with the first bush. The load connection element has a first holding element disposed near the first cutout, the holding element engaging in a groove in the housing wall which runs perpendicular to the X direction.

14 Claims, 6 Drawing Sheets

(51) Int. Cl.
*H01L 23/495* (2006.01)
*H05K 7/14* (2006.01)
*H05K 7/20* (2006.01)
*H01L 23/473* (2006.01)
*H01L 23/04* (2006.01)
*H02M 7/00* (2006.01)
*H01L 23/00* (2006.01)
*H01L 25/07* (2006.01)

(52) U.S. Cl.
CPC ....... *H05K 7/1432* (2013.01); *H05K 7/20927* (2013.01); *H01L 24/29* (2013.01); *H01L 24/32* (2013.01); *H01L 24/48* (2013.01); *H01L 24/73* (2013.01); *H01L 25/072* (2013.01); *H01L 2224/291* (2013.01); *H01L 2224/32225* (2013.01); *H01L 2224/48137* (2013.01); *H01L 2224/48227* (2013.01); *H01L 2224/73265* (2013.01); *H01L 2924/00014* (2013.01); *H01L 2924/1203* (2013.01); *H01L 2924/1301* (2013.01); *H01L 2924/13055* (2013.01); *H01L 2924/13091* (2013.01); *H01L 2924/181* (2013.01); *H02M 7/003* (2013.01)

(58) Field of Classification Search
USPC .................................................... 361/679.21
See application file for complete search history.

(56) References Cited

U.S. PATENT DOCUMENTS 7,848,112 B2 * 12/2010 Matsumoto ............. H01R 4/04
361/730
7,965,510 B2   6/2011 Suzuki
8,134,838 B2 *  3/2012 Essert ................ H01L 23/3735
174/520

FOREIGN PATENT DOCUMENTS

| | | |
|---|---|---|
| CN | 101640494 A | 2/2010 |
| DE | 10 2007 038 335 A1 | 5/2008 |
| EP | 0 513 410 A1 | 11/1992 |
| EP | 2006986 A1 | 12/2008 |
| JP | H10-116 961 | 5/1998 |

* cited by examiner

POWER SEMICONDUCTOR ARRANGEMENT

BACKGROUND OF THE INVENTION

1. Field of the Invention

The invention is directed to a power semiconductor device.

2. Description of the Related Art

In known power semiconductor devices, power semiconductor components, such as power semiconductor switches and diodes, are generally disposed on a substrate and electrically conductively connected to one another by a conductor layer of the substrate as well as bonding wires and/or a film composite. The power semiconductor switches in this case are generally in the form of transistors, such as, for example, IGBTs (Insulated-Gate Bipolar Transistors) or MOSFETs (Metal-Oxide Semiconductor Field-Effect Transistors) or in the form of thyristors.

The power semiconductor components disposed on the substrate are in this case often electrically interconnected to form one or more so-called half-bridge circuits, which are used, for example, for rectifying and inverting electric voltages and currents.

Conventional power semiconductor devices have load connection elements for conducting load currents, with the aid of which load connection elements the power semiconductor devices are electrically conductively connected to external components via electrically conductive power line elements, such as busbars, for example. The load currents in this case generally have a high current intensity in comparison with auxiliary currents which are used for actuating the power semiconductor switches, for example. The load connection elements generally run through the housing of the respective power semiconductor device. The load connection elements each have an outer connection section disposed outside the housing and an inner connection section disposed within the housing. The inner connection section of the load connection elements is intended to move as little as possible or to be subjected to compressive or tensile loading as little as possible when electrical contact is made (for example by screw connections) between the load connection elements and the power line elements, such as, for example, the busbars, and during operation of the power semiconductor device since, as a result, the life of the electrically conductive connections between the load connection elements and, for example, the substrate of the power semiconductor device, which connections are disposed in the interior of the housing of the power semiconductor device, is reduced. Owing to mechanical tolerances of the power line elements and the power semiconductor device and the spacing thereof from one another, compressive or tensile loading often occurs at the outer connection sections of the load connection elements, which results in the above-described undesired movements of the inner connection sections of the load connection elements.

SUMMARY OF THE INVENTION

It is an object of the invention is to provide an improved and more reliable power semiconductor device with a long service life.

This object is achieved by a power semiconductor device comprising a substrate and power semiconductor components disposed on, and connected to, the substrate. The inventive power semiconductor device further has a housing part, which includes a housing wall having a cutout. The power semiconductor device has a first load connection element, for making electrical contact with the power semiconductor device. The first load connection element passes through the cutout in the housing wall in an X direction, is electrically conductive, is formed in one piece and has a first outer connection section disposed outside the housing part and a first inner connection section disposed within the housing part. A first bush which is provided with an internal thread and runs in the X direction, is rotationally fixed and is movable in the X direction in the housing wall. The first outer connection section has a cutout, aligned with the first bush. The first load connection element has a first holding element disposed in the vicinity of the cutout in the housing wall, the holding element engaging a first groove in the housing wall, which groove runs perpendicular to the X direction.

It has proven advantageous if a second bush provided with an internal thread and running in the X direction is rotationally fixed and is immovable in the X direction in the housing wall. No outer connection section of a load connection element of the power semiconductor device is positioned outside the housing part in front of the second bush. The second bush is electrically insulated from the power semiconductor components. As a result, decoupling of the electrical connection between the power semiconductor device and the first busbar from the mechanical connection between the power semiconductor device and the first busbar is achieved.

Furthermore, it has proven to be advantageous if the power semiconductor device has, for making electrical contact with the power semiconductor device, a unitary second load connection element, which second load connection element runs through the cutout in the housing wall in the X direction, is electrically conductive and is electrically insulated from the first load connection element, and has a second outer connection section disposed outside the housing part and a second inner connection section disposed within the housing part. A second bush provided with an internal thread and running in the X direction is rotationally fixed and is substantially immovable in the X direction in the housing wall. The second outer connection section has a cutout aligned with the second bush. As a result, the occurrence of forces between the first and second outer connection sections which originate from tolerances of the thickness of the DC busbar and/or the spacing between the first and second outer connection sections in the X direction and/or the spacing between the DC busbar and the first and second outer connection sections is reliably avoided.

In addition, it has proven to be advantageous if the first load connection element has a third holding element, which is in the form of a section of the first load connection element disposed at the end of the first load connection element. The third holding element is disposed in a third groove in the housing wall, the third groove running generally perpendicular to the X direction, and has, on both sides in the X direction, a spacing from those walls of the housing wall which delimit the third groove. As a result, the possibility for movement of the first outer connection section of the first load connection element in the X direction is limited.

Furthermore, it has proven to be advantageous if the power semiconductor device has, for making electrical contact with the power semiconductor device, a second load connection element, which runs through the cutout in the housing wall in the X direction, is electrically conductive and is electrically insulated from the first load connection element, is formed in one piece and has a second outer connection section disposed outside the housing part and a second inner connection section disposed within the housing part. A second bush provided with an internal thread and running in the X direction is rotationally fixed and is movable in the X direction in the housing wall. The second outer connection section has a cutout aligned with the second bush. The second load connection element has a second holding element, which is disposed in the vicinity of the cutout in the housing wall and which engages in a second groove in the housing wall, the second groove running generally perpendicular to the X direction. As a result, the occurrence of forces between the first and second outer connection sections which originate from tolerances of the thickness of the DC busbar and/or the spacing between the first and second outer connection sections in the X direction and/or the spacing between the DC busbar and the first and second outer connection sections is reliably avoided.

In addition, it has proven to be advantageous if the first load connection element has a third holding element, which is in the form of a section of the first load connection element disposed at the end of the first load connection element. The third holding element is disposed in a third groove in the housing wall, the third groove runs generally perpendicular to the X direction, and has, on both sides in the X direction, a spacing from those walls of the housing wall which delimit the third groove, and/or if the second load connection element has a fourth holding element, which is in the form of a section of the second load connection element which is disposed at the end of the second load connection element. The fourth holding element is disposed in a fourth groove in the housing wall, the fourth groove running generally perpendicular to the X direction, and has, on both sides in the X direction, a spacing from those walls of the housing wall which delimit the fourth groove. As a result, the possibility for movement of the first or second outer connection section in the X direction is limited.

Furthermore, it has proven to be advantageous if the first bush is at least 10% further removed from a section of the first load connection element which runs in the X direction through the cutout in the housing wall than the second bush is removed from a section of the second load connection element which runs in the X direction through the cutout in the housing wall. As a result, the second outer connection section has more flexibility in the X direction.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
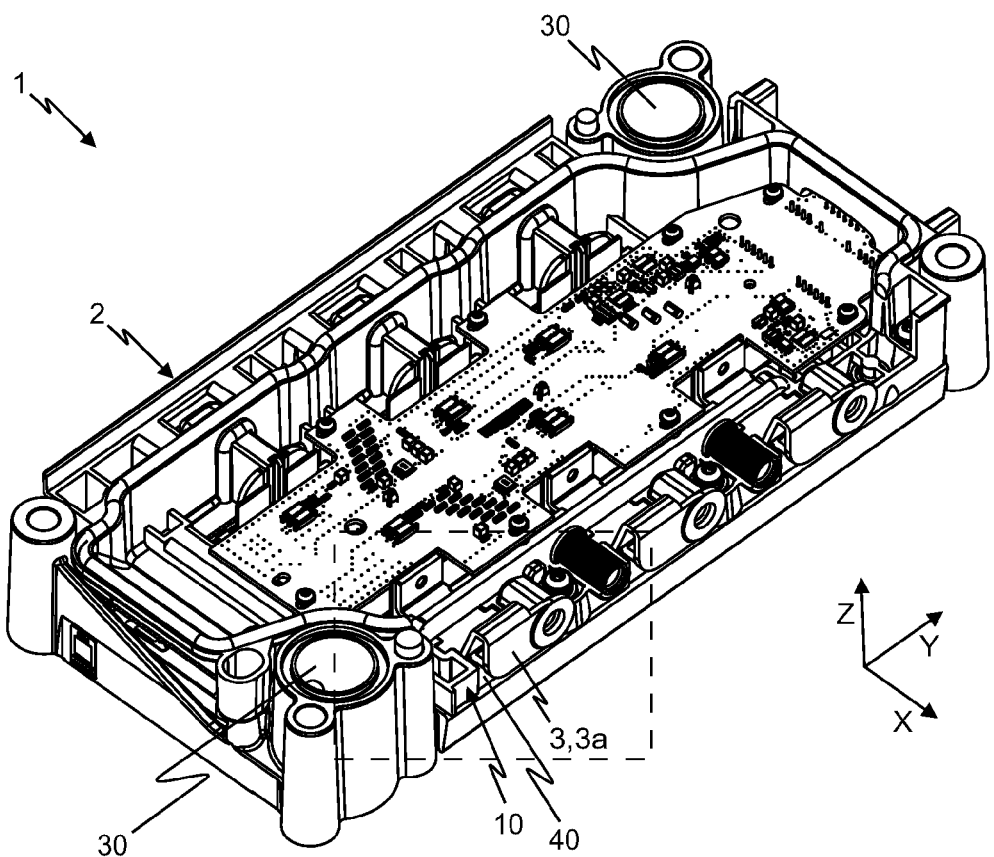
FIG. 1 shows a perspective rear view of a power semiconductor device according to the invention.
Figure 2:
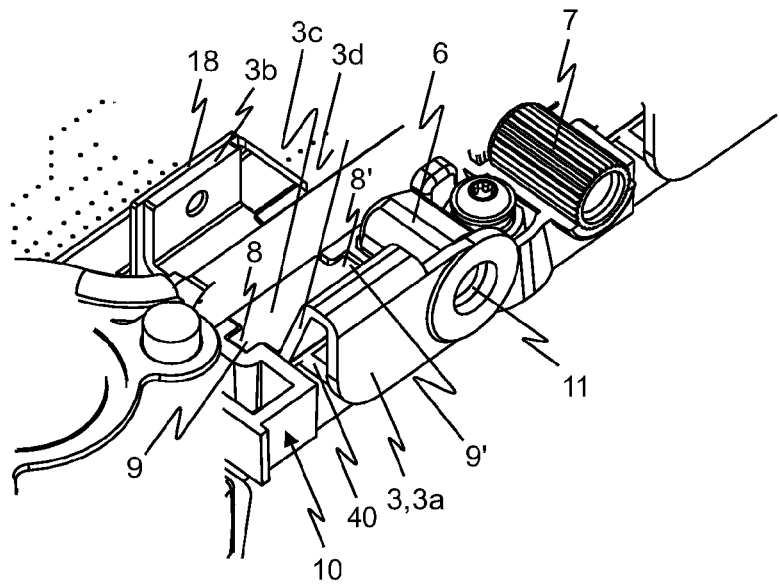
FIG. 2 shows a detail of the dashed box shown in FIG. 1.
Figure 3:
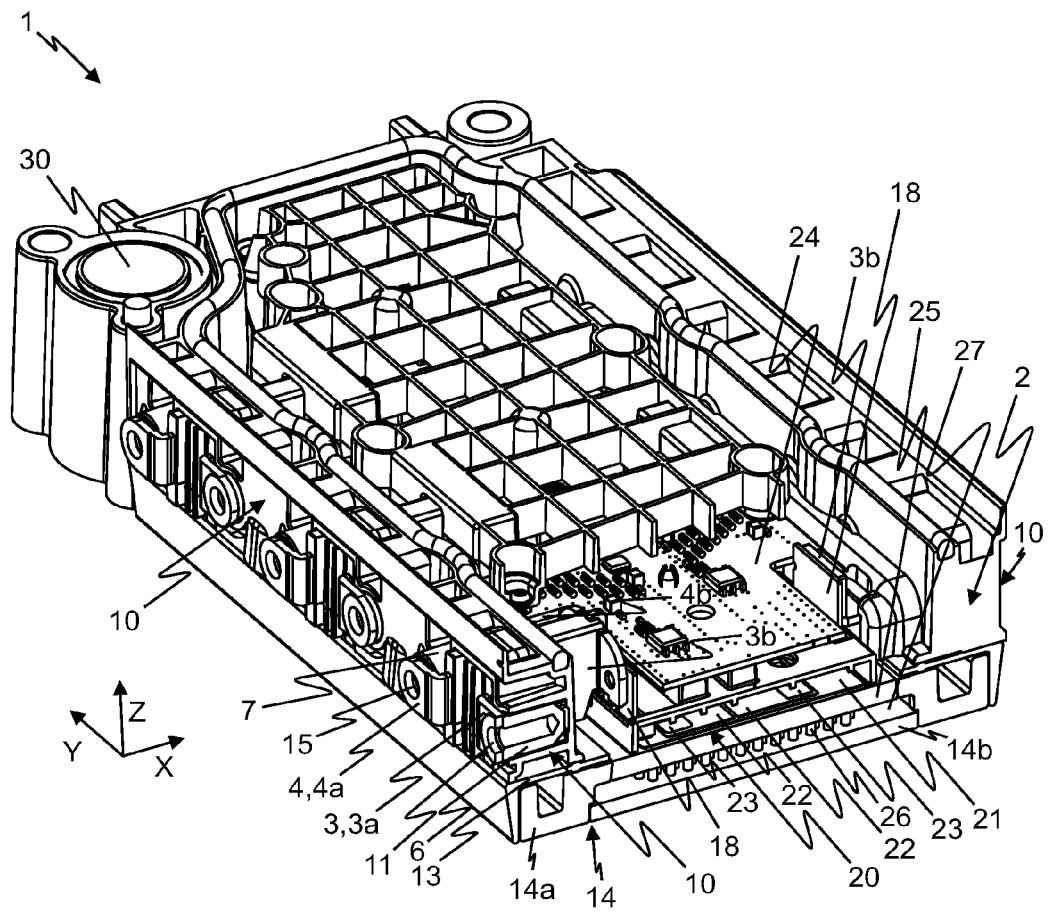
FIG. 3 shows a perspective sectional illustration of a power semiconductor device according to the invention.

FIG. 1 shows a perspective rear view of a power semiconductor device 1 according to the invention, and FIG. 2 shows a detail view from FIG. 1 (the region bordered by dashed lines in FIG. 1). FIG. 3 shows a perspective sectional illustration of power semiconductor device 1 according to the invention, wherein the front side of power semiconductor device 1 is illustrated on the left-hand side in FIG. 3.

Power semiconductor device 1 has a substrate 20, on which power semiconductor components 23 are disposed and are connected to substrate 20 (see FIG. 3). The respective power semiconductor component 23 is preferably in the form of a power semiconductor switch or a diode. The power semiconductor switches are in this case generally in the form of transistors, such as, for example, IGBTs (Insulated-Gate Bipolar Transistors) or MOSFETs (Metal-Oxide Semiconductor Field-Effect Transistors) or in the form of thyristors. Substrate 20 has an insulating body 21 (for example ceramic body) and an electrically conductive, structured first conduction layer, which is disposed on a first side of insulating body 21 and is connected to insulating body 21 and which forms, within the scope of the exemplary embodiment, conductor tracks 22 owing to its structure. Preferably, substrate 20 has an electrically conductive, preferably unstructured second conduction layer, wherein insulating body 21 is disposed between the structured first conduction layer and the second conduction layer. Substrate 20, as in the exemplary embodiment, can be in the form of a direct copper bonded substrate (DCB substrate) or in the form of an insulated metal substrate (IMS), for example. The conductor tracks of the substrate can also be formed by electrically conductive leadframes, for example, which are disposed on an insulating body, such as an electrically nonconductive film, for example. The leadframes and the electrically nonconductive film to such an extent form a substrate. Power semiconductor components 23 are preferably cohesively connected (for example by a soldered or sintered layer) to conductor tracks 22. For reasons of clarity, the soldered layer which connects power semiconductor components 23 to conductor tracks 22 cohesively is not illustrated in FIG. 3. As an alternative or in addition, power semiconductor components 23 can be connected to conductor tracks 22 by a compressive connection by virtue of, for example, a pressure being exerted on power semiconductor components 23 in the direction of conductor tracks 22.

It will be mentioned that power semiconductor components 23 are electrically conductively connected to one another on their side remote from substrate 20, by bonding wires and/or a film composite, for example, to one another and to conductor tracks 22 of substrate 20, corresponding to the desired electrical circuit which is intended to be realized by power semiconductor device 1. For reasons of clarity, these electrical connections are not illustrated in FIG. 3.

Substrate 20 is connected directly or indirectly to a metallic basic body 14. Within the scope of the exemplary embodiment, metallic basic body 14 has a frame element 14a, which passes around power semiconductor components 23, and a base element 14b, which is cohesively connected (for example by a welded joint) to frame element 14a. Metallic basic body 14 within the scope of the exemplary embodiment is in the form of a liquid heat sink. Metallic basic body 14 could also be in the form of an air heat sink, for example, which preferably has cooling fins and/or cooling pins or in the form of a base plate which is intended for connection to an air or liquid heat sink. Metallic basic body 14 within the scope of the exemplary embodiment forms a channel 27, through which a cooling liquid (for example water) flows. The cooling liquid enters or leaves channel 27 via openings 30 (see FIG. 1). Substrate 20 within the scope of the exemplary embodiment is disposed on a cooling plate 25 which is provided with cooling pins 26, which protrude into channel 27, and which is connected to cooling plate 25. Cooling plate 25 forms a cover for an opening of metallic basic body 14 and is connected to metallic basic body 14. Substrate 20 is connected to metallic basic body 14 via cooling plate 25.

Furthermore, power semiconductor device 1 has a housing part 2, which is preferably unitary, i.e., formed in one piece, and which preferably runs laterally around power semiconductor components 23. It will be mentioned here that housing part 2 does not necessarily run laterally around power semiconductor components 23 on the same plane on which power semiconductor components 23 are disposed, but can also run laterally around power semiconductor components 23 slightly above power semiconductor components 23. Housing part 2 preferably consists of plastic.

The basic body 14 has a main outer surface which runs laterally around power semiconductor components 23 and which is at least partially covered areally by an elastic, electrically nonconductive, structured sealing element 13 which is formed in one piece and which runs laterally around power semiconductor components 23.

Furthermore, power semiconductor device 1 preferably has driver circuits which are disposed on a printed circuit board 24 for actuating the power semiconductor switches.

It will be mentioned that, within the scope of the exemplary embodiment, a DC voltage is inverted into a three-phase AC voltage or a three-phase AC voltage is rectified into a DC voltage by power semiconductor device 1. The following description in this case describes by way of example the design of power semiconductor device 1 as regards substrate 20 and the elements assigned to substrate 20, with respect to the generation of a single-phase AC voltage. Substrate 20 within the scope of the exemplary embodiment is provided three times with an identical embodiment in such a way that, as already described above, a three-phase AC voltage is generated from a DC voltage or a three-phase AC voltage is rectified into a DC voltage by power semiconductor device 1 in the exemplary embodiment.

Figure 10:
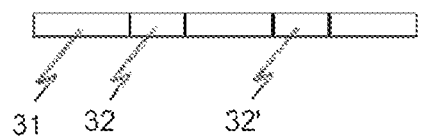
FIG. 10 shows a first busbar.

Housing part 2 has a housing wall 10, which has a cutout 40 (see FIGS. 1 and 2). Power semiconductor device 1 has a first load connection element 3 for making electrical contact with power semiconductor device 1. First load connection element 3 runs through cutout 40 in housing wall 10 in a first, X, direction, is electrically conductive, is formed in one piece and has a first outer connection section 3a disposed outside housing part 2 and a first inner connection section 3b disposed within housing part 2. In order to make electrical contact with power semiconductor device 1, the first outer connection section 3a is connected to an electrically conductive first busbar 31 (see, FIG. 10). Load connection elements 3 are used for conducting load currents. The load currents which flow through load connection elements 3 in this case generally have a high current intensity in comparison with control currents which are used, for example, for actuating power semiconductor components when the power semiconductor components are in the form of power semiconductor switches. Furthermore, power semiconductor device 1 has electrically conductive connecting elements 18, which connect substrate 20, more precisely the first conduction layer of substrate 20, to the electrically conductive load connection elements 3. Load connection elements 3 can also be formed in one piece with the respectively assigned connecting elements 18.

A first bush 6 which is provided with an internal thread and runs in the X direction is rotationally fixed and is movable in the X direction in housing wall 10. For this purpose, housing wall 10 has an opening assigned to first bush 6, wherein the geometric form of the inner wall of the opening corresponds to the geometric form of the circumference of first bush 6, and the circumference of first bush 6 has edges. First bush 6 is connected in a form-fitting manner to housing wall 10. First bush 6 is plugged into the opening assigned thereto.

The first outer connection section 3a of first load connection element 3 has, aligned with first bush 6, a cutout 11. First outer connection section 3a is preferably flexible in the X direction so that first outer connection section 3a is movable slightly in the X direction with respect to a section 3c of first load connection element 3, section 3c running through cutout 40 in the X direction. Within the scope of the exemplary embodiment, the flexibility in the X direction of first outer connection section 3a is achieved by virtue of the fact that first outer connection section 3a has a flat geometric form and is bent back, in particular bent back perpendicularly, with respect to section 3c of first load connection element 3. First outer connection section 3a preferably forms, together with an intermediate section 3d of first load connection element 3, intermediate section 3d is disposed between section 3c of first load connection element 3 and first outer connection section 3a, a u-shaped geometric form, which increases the flexibility in the X direction of first outer connection section 3a.

First load connection element 3 has a first holding element 8, which is disposed in the vicinity of cutout 40 in housing wall 10 and engages in a first groove 9 in housing wall 10, groove 9 running generally perpendicular to the X direction. First load connection element 3 preferably has a further first holding element 8', which is disposed in the vicinity of cutout 40 in housing wall 10 and engages in a further first groove 9' in housing wall 10, further first groove 9' running generally perpendicular to the X direction. The first or further first holding element 8 or 8' absorbs forces acting on first outer connection section 3a of first load connection element 3 in the X direction and thereby prevents a movement of the first inner connection section 3b in the X direction. In order to make electrical contact with power semiconductor device 1, first outer connection section 3a is connected to an electrically conductive first busbar 31 (see FIG. 10), wherein the connection is preferably realized by a screw connection. For this purpose, first busbar 31 preferably has a cutout 32. In order to realize the screw connection, the shaft of a screw is passed through cutout 32 in first busbar 31 and through cutout 11 in first outer connection section 3a and the screw is screwed into first bush 6. Forces acting on outer connection section 3a in the X direction in the process are not transferred to first inner connection section 3b, and also no forces acting in the X direction are transferred to housing part 2 since first bush 6 is movable in the X direction. Since first bush 6 is movable in the X direction, also no forces acting additionally in the X direction arise during tightening of the screw through first bush 6, which forces would need to be absorbed by the first or further first holding element 8 or 8'.

Existing tolerances of the elements involved and of the spacing between first outer connection section 3a and first busbar 31 can thus be compensated for, wherein no movement of first inner connection section 3b occurs or no forces act on first inner connection section 3b in the X direction from the outside.

Preferably, a second bush 7 which is provided with an internal thread and runs in the X direction is rotationally fixed and is immovable in the X direction in housing wall 10, wherein no outer connection section of a load connection element of power semiconductor device 1 is disposed outside housing part 2 in front of second bush 7. Within the scope of the exemplary embodiment, second bush 7 is rotationally fixed and is immovable in the X direction by virtue of second bush 7 being cohesively connected to housing wall 10 (for example by virtue of it being injection-molded into the housing wall as well). Second bush 7 is electrically insulated from power semiconductor components 23. First busbar 31 can be mechanically connected to power semiconductor device 1, more precisely to housing part 2 of power semiconductor device 1, by second bush 7, while the electrically conductive connection between power semiconductor device 1 and first busbar 31 is realized by first bush 6. As a result, decoupling of the electrical connection between power semiconductor device 1 and first busbar 31 from the mechanical connection between power semiconductor device 1 and first busbar 31 is achieved. For this purpose, first busbar 31 preferably has a further cutout 32'. The shaft of a screw is passed through the further cutout 32' in first busbar 31 in order to realize the screw connection and the screw is screwed into second bush 7.

Figure 4:
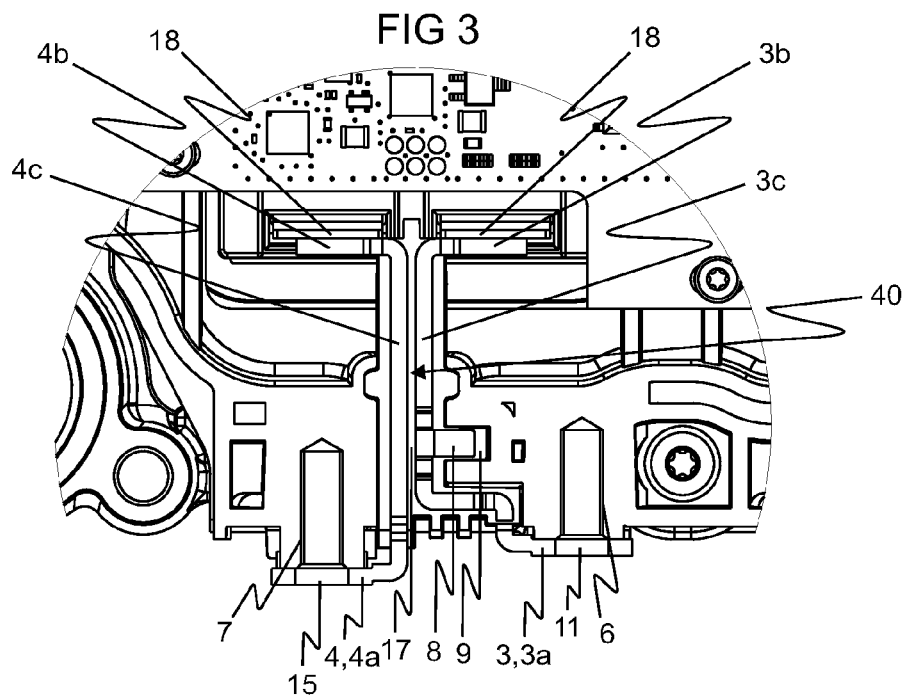
FIG. 4 shows a sectional view of a front-side detail of a power semiconductor device according to the invention.
Figure 5:
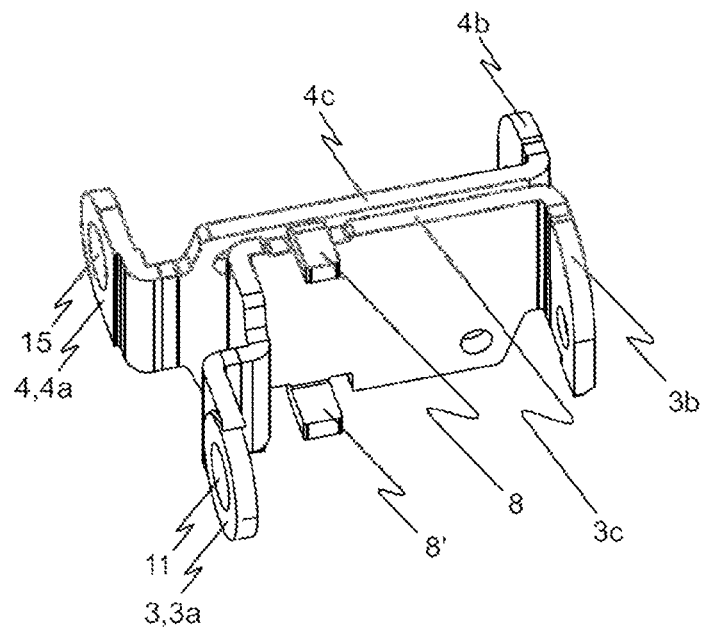
FIG. 5 shows a perspective illustration of first and second load connection elements.

FIG. 3 shows, on the left-hand side, the front side of power semiconductor device 1. FIG. 4 shows a sectional view of a front-side detail of power semiconductor device 1. FIG. 5 shows a perspective illustration of a first and second load connection element 3 and 4, wherein first load connection element 3, in terms of its basic structure, is substantially designed as load connection element 3 shown in FIG. 2, and first bush 6 is designed and disposed as first bush 6 shown in FIG. 2.

Figure 11:
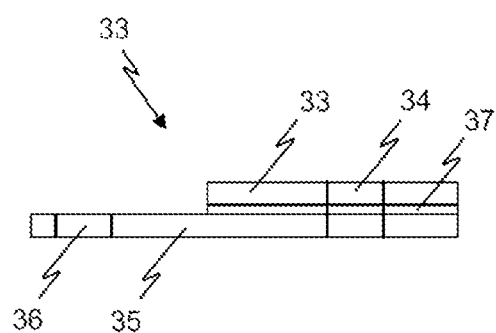
FIG. 11 shows a DC busbar.

Within the scope of the exemplary embodiment, power semiconductor device 1 has, for making electrical contact with power semiconductor device 1, in addition, a second load connection element 4, which runs through cutout 40 in housing wall 10 in the X direction, is electrically conductive and is electrically insulated from first load connection element 3, is formed in one piece and has a second outer connection section 4a disposed outside housing part 2 and a second inner connection section 4b disposed within housing part 2. While first load connection element 3 shown in FIGS. 1 and 2 is preferably used for connecting a busbar 31 having an AC voltage potential during operation, first load connection element 3 shown in FIG. 3 and FIG. 4 and second load connection element 4 shown in FIG. 3 and FIG. 4 are preferably used for connecting a DC busbar 33 (see, FIG. 11), which has a first busbar 33 having a first DC voltage potential (for example positive electrical potential) during operation and a second busbar 35 having a second DC voltage potential (for example negative electrical potential) during operation. An electrically nonconductive insulation layer 37 is disposed between first and second busbars 33 and 35. DC busbar 33 has a cutout 34 running through first and second busbars 33 and 35 and through insulation layer 37. Second busbar 35 has a cutout 36.

A first bush 6 provided with an internal thread and running in the X direction is rotationally fixed and is movable in the X direction in housing wall 10. For this purpose, housing wall 10 has an opening assigned to first bush 6, wherein the geometric form of the inner wall of the opening corresponds to the geometric form of the circumference of first bush 6, and the circumference of first bush 6 has edges. First bush 6 is connected in a form-fitting manner to housing wall 10. First bush 6 is plugged into the opening assigned thereto.

Furthermore, a second bush 7 provided with an internal thread and running in the X direction is rotationally fixed and is immovable in the X direction in housing wall 10, wherein second outer connection section 4a of second load connection element 4 has, aligned with second bush 7, a cutout 15. Within the scope of the exemplary embodiment, second bush 7 is rotationally fixed and is immovable in the X direction by virtue of second bush 7 being cohesively connected to housing wall 10 (for example by virtue of it being injection-molded into the housing wall as well).

First outer connection section 3a is preferably flexible in the X direction so that first outer connection section 3a is slightly movable in the X direction with respect to a section 3c of first load connection element 3, section 3c running through cutout 40 in the X direction. Within the scope of the exemplary embodiment, the flexibility in the X direction of first outer connection section 3a is achieved by virtue of the fact that first outer connection section 3a has a flat geometric form and is bent back, in particular bent back generally perpendicularly, with respect to section 3c of first load connection element 3.

Furthermore, second outer connection section 4a is preferably flexible in the X direction so that second outer connection section 4a is slightly movable in the X direction with respect to a section 4c of second load connection element 4, section 4c running through cutout 40 in the X direction. Within the scope of the exemplary embodiment, the flexibility in the X direction of second outer connection section 4a is achieved by virtue of the fact that second outer connection section 4a has a flat geometric form and is bent back, in particular bent back generally perpendicularly, with respect to section 4c of second load connection element 4. Within the scope of the exemplary embodiment, the flexibility of second outer connection section 4a in the X direction is increased by virtue of first bush 6 being at least 10%, in particular at least 20%, further removed from a section 3c of first load connection element 3, section 3c running through cutout 40 in housing wall 10 in the X direction, than second bush 7 is removed from a section 4c of second load connection element 4, section 4c running through cutout 40 in housing wall 10 in the X direction. First load connection element 3 therefore preferably has a larger outwardly leading lever arm than second load connection element 4.

In order to make electrical contact with power semiconductor device 1, first outer connection section 3a is connected to electrically conductive first busbar 33 (see FIG. 11), wherein the connection is preferably realized by a screw connection. In order to realize the screw connection, the shaft of a screw is passed through cutout 34 in DC busbar 33 and through cutout 11 in first outer connection section 3a, and the screw is screwed into first bush 6.

In order to make electrical contact with power semiconductor device 1, furthermore, second outer connection section 4a is connected to electrically conductive second busbar 35 (see, FIG. 11), wherein the connection is preferably realized by a screw connection. In order to realize the screw connection, the shaft of a screw is passed through cutout 36 in second busbar 35 and through cutout 15 in second outer connection section 4a, and the screw is screwed into second bush 7.

Forces acting on outer connection section 3a in the X direction in the process are not transferred to the first inner connection section 3b, and also no forces acting in the X direction are transferred to housing part 2 since first bush 6 is movable in the X direction. Since first bush 6 is movable in the X direction, no forces acting additionally in the X direction are produced during tightening of the screw through first bush 6 which would need to be absorbed by first or further first holding element 8 or 8' of first load connection element 3.

Existing tolerances of the elements involved and the spacing between the first and second outer connection sections 3a and 4a and DC busbar 33 can be compensated for hereby, wherein no movement of first and second inner connection sections 3b and 4b arises or no forces act on the first and second inner connection sections 3a and 3b in the X direction from the outside. In particular, as a result the occurrence of forces between the first and second outer connection sections 3a and 4a which originate from tolerances of the thickness of DC busbar 33 and/or the spacing between the first and second outer connection sections 3a and 4a in the X direction and/or the spacing between DC busbar 33 and first and second outer connection sections 3a and 4a is reliably avoided.

Figure 6:
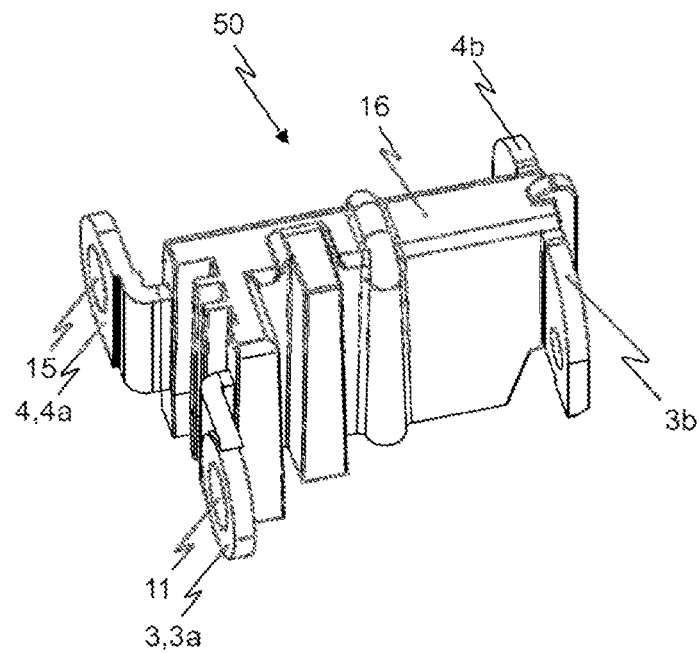
FIG. 6 shows a perspective illustration of first and second load connection elements, which are laterally surrounded by an electrically nonconductive elastomer.

Preferably, as illustrated by way of example in FIG. 6, the sections 3c and 4c of first and second load connection elements 3 and 4, said sections running in the X direction through cutout 40, are surrounded by an electrically nonconductive elastomer 16 so that a load connection apparatus 50 having first and second load connection elements 3 and 4 and elastomer 16 is in the form of a structural unit. Elastomer 16 fills the gap 17 provided between first and second load connection elements 3 and 4. Elastomer 16 is preferably in the form of silicone. The silicone is preferably in the form of a crosslinked liquid silicone rubber or in the form of a crosslinked solid silicone rubber. Load connection apparatuses 50 are introduced into the cutouts 40 during fitting of power semiconductor device 1.

Figure 7:
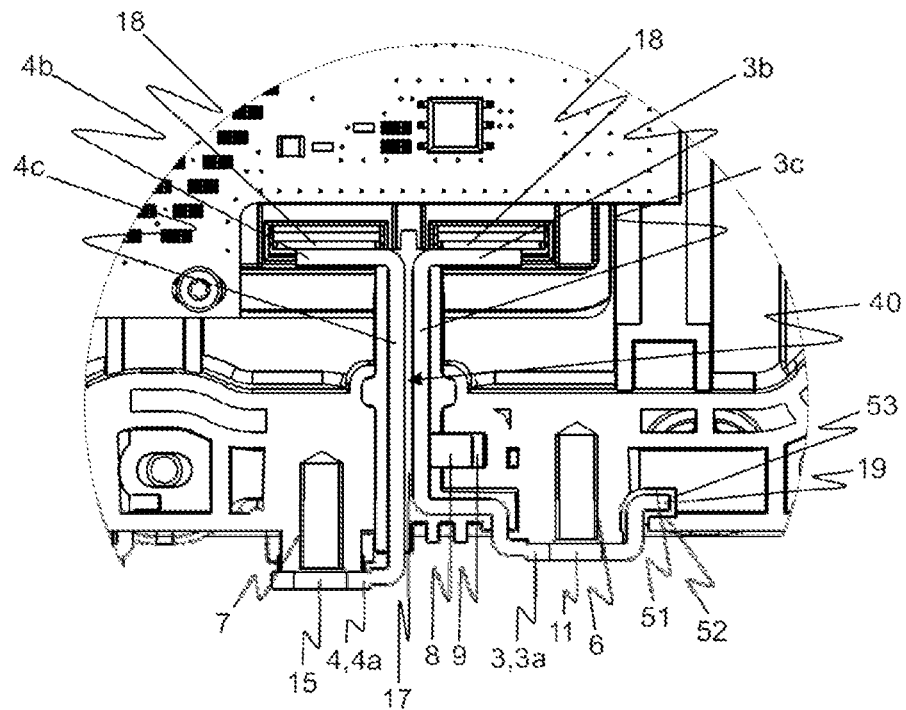
FIG. 7 shows a sectioned view of a front-side detail of a further power semiconductor device according to the invention.
Figure 8:
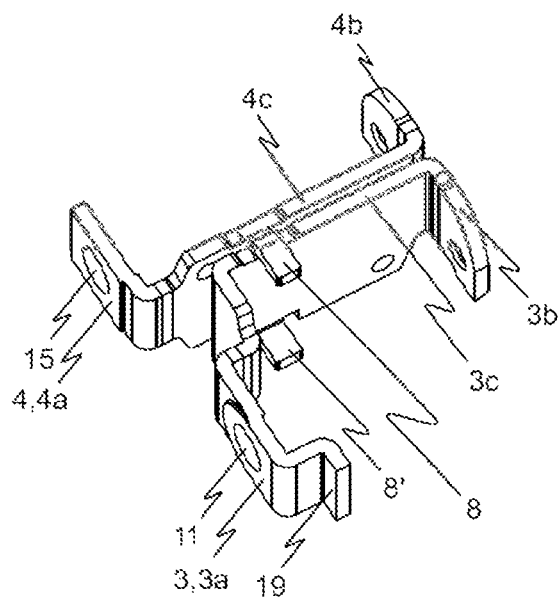
FIG. 8 shows a perspective illustration of first and second load connection elements of the further power semiconductor device according to the invention.
Figure 9:
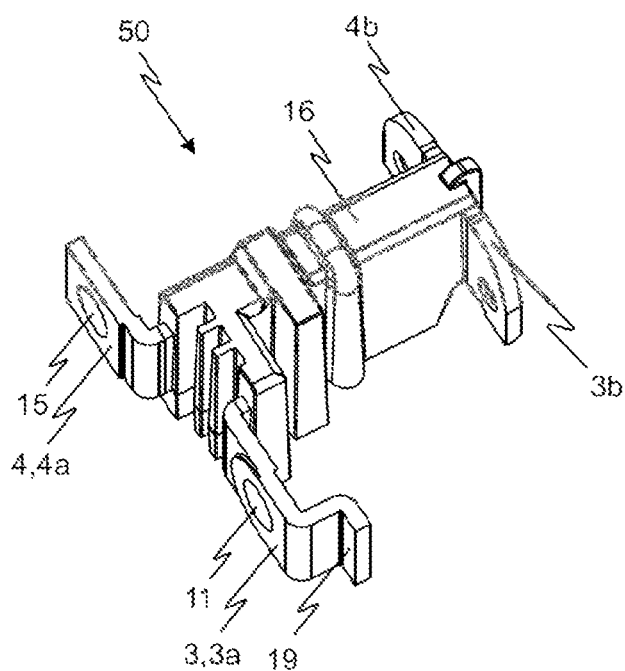
FIG. 9 shows a perspective illustration of first and second load connection elements of the further power semiconductor device according to the invention, which are laterally surrounded by an electrically nonconductive elastomer.

FIG. 7 shows a sectional view of a front-side detail of a further power semiconductor device 1 according to the invention. FIG. 8 shows a perspective illustration of a first and second load connection element 3 and 4 of the further power semiconductor device 1 according to the invention, and FIG. 9 shows a perspective illustration of the first and second load connection elements 3 and 4 of the further power semiconductor device 1 according to the invention which are laterally surrounded by an electrically nonconductive elastomer. The further power semiconductor device 1 according to the invention shown in FIG. 7 corresponds to the power semiconductor devices 1 described in connection with FIGS. 3 to 6 (including described possible advantageous embodiments) apart from the feature that first load connection element 3 has a third holding element 19, which is in the form of a section of first load connection element 3 which is disposed at the end of first load connection element 3, wherein third holding element 19 is disposed in a third groove 53 in housing wall 10, third groove 53 running generally perpendicular to the X direction, and has, on both sides in the X direction, a spacing from those walls 51 and 52 of housing wall 10 which delimit third groove 53. Third holding element 19 limits, in the X direction, the possible movement of first outer connection section 3a of first load connection element 3.

Figure 12:
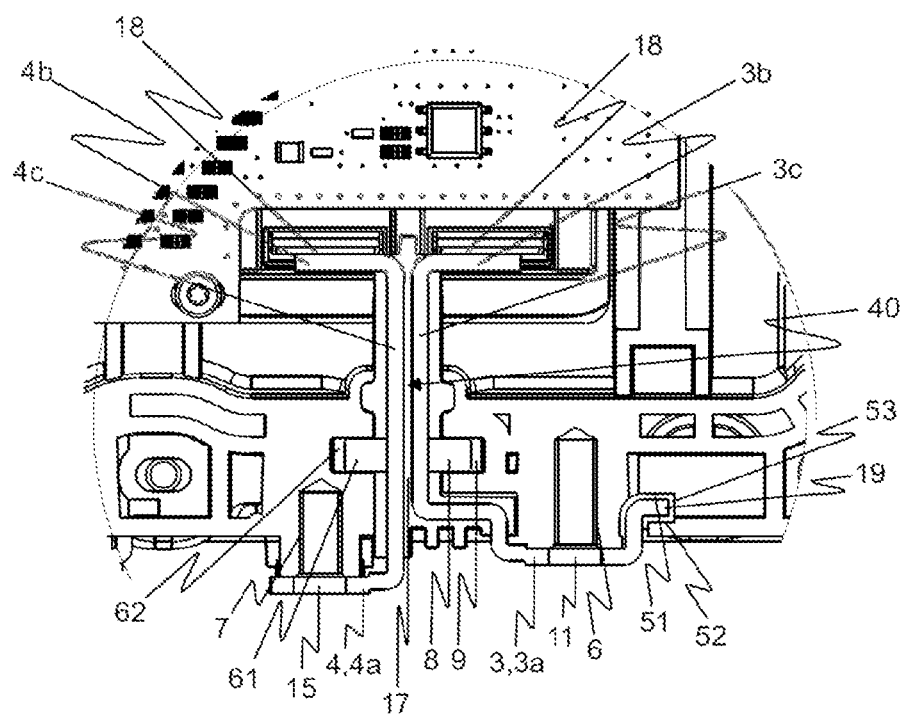
FIG. 12 shows a sectional view of a front-side detail of a further power semiconductor device according to the invention.

FIG. 12 shows a sectional view of a front-side detail of a further power semiconductor device 1 according to the invention. The further power semiconductor device 1 according to the invention shown in FIG. 12 corresponds to the power semiconductor devices 1 described in connection with FIGS. 3 to 7 (including described possible advantageous embodiments) apart from the features that second bush 7 is movable in the X direction and second load connection element 4 has a second holding element 61, which is disposed in the vicinity of cutout 40 in housing wall 10 and engages in a second groove 62 in housing wall 10, second groove 62 running generally perpendicularly to the X direction.

Second load connection element 4 shown in FIG. 12 preferably has, similarly to the embodiment illustrated by way of example in FIG. 8, a further second holding element (not shown in FIG. 12), which is disposed in the vicinity of cutout 40 in housing wall 10 and engages in second groove 62 in housing wall 10. Second holding element 61 or the further second holding element absorbs forces acting on second outer connection section 4a of second load connection element 4 in the X direction and thereby prevents a movement of second inner connection section 4b in the X direction.

Furthermore, also in the case of power semiconductor device 1 shown in FIG. 12, first load connection element 3 can have a third holding element 19, which is in the form of a section of the first load connection element 2 which is disposed at the end of first load connection element 2, wherein third holding element 19 is disposed in a third groove 53 in housing wall 10, third groove 53 running generally perpendicularly to the X direction, and has, on both sides in the X direction, a spacing from those walls of housing wall 10 which delimit third groove 53. As an alternative or in addition, second load connection element 4, analogously to first load connection element 3, can have a fourth holding element (not illustrated in FIG. 12 for reasons of clarity), which is in the form of a section of second load connection element 4 which is disposed at the end of second load connection element 4, wherein the fourth holding element is disposed in a fourth groove (not illustrated in FIG. 12 for reasons of clarity) in housing wall 10, said fourth groove running generally perpendicular to the X direction, and has, on both sides in the X direction, a spacing from those walls of the housing wall which delimit the fourth groove.

Preferably, the first, further first, second, third and fourth grooves in housing wall 10 run in the Z direction.

It will furthermore be mentioned that first and second load connection elements 3 and 4, respectively, are preferably in the form of multiply bent-back sheet-metal elements.

Furthermore, it will be mentioned that the first and second busbars are preferably in the form of sheet-metal elements.

In addition, it will be mentioned that the housing of the power semiconductor device can consist only of the housing part or can have still further housing parts.

It will be mentioned at this juncture that features of various exemplary embodiments of the invention, insofar as the features are not mutually exclusive, can of course be combined with one another as desired.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor device comprising:
    a substrate;
    a plurality of power semiconductor components disposed on and connected to said substrate;
    a housing part having a housing wall with a first cutout and a first groove therein, said first groove running in a first direction;
    a first, electrically conductive, load connection element for making electrical contact with the power semiconductor device, said first load connection element passing through said first cutout in a second direction generally perpendicular to said first direction, said first load connection element being formed in one piece, and having a first outer connection section disposed outside said housing part in a plane perpendicular to said second direction and parallel to a first inner connection section disposed within said housing part; and
    a first bush which has an internal thread and which runs in said second direction, said first bush being disposed in rotationally fixed fashion and is movable in said second direction in said housing wall;
    wherein said first outer connection section has a second cutout aligned with said first bush;
    wherein said first load connection element has a first holding element disposed in the vicinity of said first cutout, said first holding element engaging in said first groove; and an intermediate section disposed between said first holding element and said first outer connection section and forming a generally U-shaped form; thereby, forces acting on said first outer connection section are absorbed and not transferred to said first inner connection section.

2. The power semiconductor device of claim 1, further comprising:
    a second bush having an internal thread and running in said second direction, said second bush being disposed in rotationally fixed fashion and is immovable in said second direction in said housing wall;
    wherein no outer connection section of one of said load connection elements is disposed outside said housing part in front of said second bush, and said second bush is electrically insulated from said plurality of power semiconductor components.

3. The power semiconductor device of claim 1, further comprising:
    a second load connection element for making electrical contact with the power semiconductor device,
        said second load connection element running through said first cutout in said second direction,
        said second load connection element being electrically conductive,
        said second load connection element being electrically insulated from said first load connection element,
        said second load connection element being formed in one piece, and
        said second load connection element having a second outer connection section disposed outside said housing part and a second inner connection section disposed within said housing part;
    wherein a second bush, having an internal thread and running in said second direction, is disposed in rotationally fixed fashion is substantially immovable in said second direction in said housing wall; and
    wherein said second outer connection section has a third cutout aligned with said second bush.

4. The power semiconductor device of claim 3, wherein said first bush is at least about 10% further removed from a section of said first load connection element which runs in said second direction through said second cutout than said second bush is removed from a section of said second load connection element which runs in said second direction through said second cutout.

5. The power semiconductor device of claim 3
    wherein said first load connection element has a third holding element, which is in the form of a section of said first load connection element and which is disposed at the end of said first load connection element;
    wherein said third holding element is disposed in a third groove in said housing wall, said third groove running generally perpendicular to said second direction, and having, on both sides in said second direction, a spacing from those walls of said housing wall which delimit said third groove.

6. The power semiconductor device of claim 5, wherein said first bush is at least about 10% further removed from a section of said first load connection element which runs in said second direction through said second cutout than said second bush is removed from a section of said second load connection element which runs in said second direction through said second cutout.

7. The power semiconductor device of claim 1,
    further comprises a second load connection element, for making electrical contact with the power semiconductor device, said second load connection element running through said second cutout in said second direction, said second load connection element being electrically conductive, said second load connection element being electrically insulated from said first load connection element, said second load connection element being formed in one piece, and said second load connection element having a second outer connection section disposed outside said housing part and a second inner connection section disposed within said housing part;

wherein a second bush, having an internal thread and running in said second direction, is disposed in rotationally fixed fashion and is movable in said second direction in said housing wall;

wherein said second outer connection section has a third cutout aligned with said second bush; and wherein said second load connection element has a second holding element, which is disposed in the vicinity of said second cutout and which engages in a second groove in said housing wall, said second groove running generally perpendicular to said second direction.

8. The power semiconductor device of claim 7, wherein said first bush is at least about 10% further removed from a section of said first load connection element which runs in said second direction through said second cutout than said second bush is removed from a section of said second load connection element which runs in said second direction through said second cutout.

9. The power semiconductor device of claim 7, wherein said first load connection element has a third holding element, which is in the form of a section of said first load connection element which is disposed at the end of said first load connection element;

wherein said third holding element is disposed in a third groove in said housing wall, said third groove running generally perpendicular to said second direction, and having, on both sides in said second direction, a spacing from those walls of said housing wall which delimit said third groove.

10. The power semiconductor device of claim 9, wherein said first bush is at least about 10% further removed from a section of said first load connection element which runs in said second direction through said second cutout than said second bush is removed from a section of said second load connection element which runs in said second direction through said second cutout.

11. The power semiconductor device of claim 9, wherein said second load connection element has a fourth holding element, which is in the form of a section of said second load connection element which is disposed at the end of said second load connection element; and wherein said fourth holding element is disposed in a fourth groove in said housing wall, said fourth groove running generally perpendicular to said second direction, and has, on both sides in said second direction, a spacing from those walls of said housing wall which delimit said fourth groove.

12. The power semiconductor device of claim 11, wherein said first bush is at least about 10% further removed from a section of said first load connection element which runs in said second direction through said second cutout than said second bush is removed from a section of said second load connection element which runs in said second direction through said second cutout.

13. The power semiconductor device of claim 7, wherein said first load connection element has a third holding element, which is in the form of a section of said first load connection element which is disposed at the end of said first load connection element;

wherein said second load connection element has a fourth holding element, which is in the form of a section of said second load connection element which is disposed at the end of said second load connection element;

wherein said fourth holding element is disposed in a fourth groove in said housing wall, said fourth groove running generally perpendicular to said second direction, and has, on both sides in said second direction, a spacing from those walls of said housing wall which delimit said fourth groove.

14. The power semiconductor device of claim 13, wherein said first bush is at least about 10% further removed from a section of said first load connection element which runs in said second direction through said second cutout than said second bush is removed from a section of said second load connection element which runs in said second direction through said second cutout.

\* \* \* \* \*